United States Patent
Spaziani et al.

(10) Patent No.: US 8,703,369 B2
(45) Date of Patent: Apr. 22, 2014

(54) METHOD OF DETERMINING FOCUS AND DOSE OF AN APPARATUS OF OPTICAL MICRO-LITHOGRAPHY

(75) Inventors: Nicolas Spaziani, Meylan (FR); Jean Massin, Meylan (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 1 day.

(21) Appl. No.: 13/568,996

(22) Filed: Aug. 7, 2012

(65) Prior Publication Data

US 2013/0040230 A1 Feb. 14, 2013

(30) Foreign Application Priority Data

Aug. 8, 2011 (FR) ...................... 11 57245

(51) Int. Cl.
*G03F 7/20* (2006.01)
(52) U.S. Cl.
CPC .......... *G03F 7/70641* (2013.01); *G03F 7/2037* (2013.01); *G03F 7/70625* (2013.01); *Y10S 430/143* (2013.01)
USPC .............. 430/30; 430/296; 430/942; 356/636
(58) Field of Classification Search
CPC G03F 7/2037; G03F 7/70625; G03F 7/70641
USPC .............................. 430/30, 296, 942; 356/636
See application file for complete search history.

(56) References Cited

U.S. PATENT DOCUMENTS

| | | | |
|---|---|---|---|
| 5,592,259 A | 1/1997 | Anzai et al. | |
| 7,598,007 B2 * | 10/2009 | Yamamoto | ........................ 430/5 |
| 2008/0153011 A1 | 6/2008 | Yamamoto | |
| 2008/0297752 A1 | 12/2008 | Wang et al. | |
| 2009/0284722 A1 | 11/2009 | Gabor et al. | |

FOREIGN PATENT DOCUMENTS

| | | |
|---|---|---|
| JP | 2220425 A | 9/1990 |
| JP | 2004 253589 A | 9/2004 |

OTHER PUBLICATIONS

Spaziani, Nicolas, et al., "Lithography Process Control Using Focus and Dose Optimisation Technique," Proceedings of SPIE—Optical Microlithography XXIV, vol. 7973, Mar. 1, 2011, pp. 79732Z-1-79732Z-6.

* cited by examiner

*Primary Examiner* — Christopher Young
(74) *Attorney, Agent, or Firm* — Seed IP Law Group PLLC

(57) ABSTRACT

In one or more embodiments, the disclosure relates to a method of setting a photolithography exposure machine, comprising: forming on a photolithography mask test patterns and circuit patterns, transferring the patterns to a resin layer covering a wafer, measuring a critical dimension of each test pattern transferred, and determining a focus setting error value of the photolithography machine from the measure of the critical dimension of each pattern, the test patterns formed on the mask comprising a first reference test pattern and a second test pattern forming for a photon beam emitted by the photolithography machine and going through the mask, an optical path having a length different from an optical path formed by the first test pattern and the circuit patterns formed on the mask.

14 Claims, 4 Drawing Sheets

METHOD OF DETERMINING FOCUS AND DOSE OF AN APPARATUS OF OPTICAL MICRO-LITHOGRAPHY

BACKGROUND

1. Technical Field

The present disclosure relates to the field of photolithography implemented for the manufacture of integrated circuits.

2. Description of the Related Art

Photolithography is currently used in microelectronics to transfer patterns present on a mask to a resin layer deposited on a substrate. To that end, a photolithography exposure machine is used, configured to project a photon beam focused on the resin layer through the mask. The resolution of the patterns formed in the resin is proportional to a dimension called "Critical Dimension" CD equal to $k \cdot \lambda / NA$, where k is a coefficient lower than 1 linked to characteristics of the machine, $\lambda$ is the wavelength of the photons of the beam and NA is the numerical aperture of the photon beam at the mask level. The critical dimension of a photolithography machine is the width of the smallest shape susceptible of being transferred to a resin layer by the machine.

Independently of this critical dimension, the photolithography machine settings are of great importance, and all the more since the critical dimension to be reached is low. Indeed, the depth of field of a photolithography machine is proportional to $\lambda / NA^2$ ($= k2 \cdot CD/NA$, where k2 is a proportionality coefficient). Therefore, the lower the critical dimension, the lower the depth of field of the photolithography machine. The result is that the focus setting of the photolithography machine becomes more and more sensitive as the critical dimension is reduced. This focus setting affects the edge slope of the patterns formed in the resin layer. In addition, the intensity of the photon beam emitted by the photolithography machine, called "dose", affects the accuracy with which the mask patterns are transferred to the resin layer, and in particular the width of these patterns. It is known to form test patterns on photolithography masks, to transfer these test patterns to a resin layer, and to measure the dimensions of the test patterns formed in the resin layer. The measures obtained allow focus and dose setting values of the photolithography machine to be obtained.

FIG. 1A schematically shows profiles of test patterns formed in a resin layer on an axis of increasing focus F values of a photolithography machine. At the center of the axis, a pattern profile having vertical edges obtained with a focus setting of the machine at an optimal value Fop is shown. At focus values lower than 50 nm and 100 nm at the value Fop (Fop−100 and Fop−50), the pattern profiles obtained have edges whose slope is higher than 90°. The base width of the pattern obtained is therefore lower than that of the upper face of the pattern. At focus values higher than 50 nm and 100 nm at the value Fop (Fop+50 and Fop+100), the pattern profiles obtained have edges whose slope is on the contrary lower than 90°. The base width of the pattern obtained is therefore higher than that of the upper face of the patterns.

FIG. 1B shows a variation curve C1 of the critical dimension CD of a test pattern at average height, as a function of the focus F setting of the photolithography machine. Curve C1 shows the shape of a parabola centered on the focus setting optimal value Fop. The curve C1 shows that a measured value of critical dimension CDm corresponds to two focus setting values Fop−Fm and Fop+Fm on each side of the optimal value Fop. These two values correspond to pattern profiles on the right and the left of the optimal pattern Fop on the axis of FIG. 1A. The result is that, in general, a single measure of critical dimension CDm limits the ability to determine a focus setting value to be made. There is indeed a doubt between two focus correction values +Fm and −Fm. Therefore, the higher the focus F setting value, the narrower the upper face of the pattern profile.

FIG. 2A schematically shows profiles of test patterns formed in a resin layer, on an axis of increasing dose D values emitted by a photolithography machine. At the center of the axis, a profile of pattern having a desired width at average height is shown. This profile is obtained with a dose setting of the machine at an optimal value Dop. At lower dose values of 0.5 and 1 mJ/cm$^2$ at the optimal value Dop (Dop−0.5 and Dop−1), the width of the profiles at average height, of the patterns obtained is higher at the desired width. At higher dose values of 0.5 and 1 mJ/cm$^2$ at the value Dop (Dop+0.5 and Dop+1), the profiles of the patterns obtained have a width at average height which is on the contrary lower than the desired width. Therefore, the higher the dose setting value, the narrower the width of the pattern profiles.

FIG. 2B shows a variation curve C2 of the minimum width of a pattern CD as a function of the dose D setting emitted by the photolithography machine. The curve C2 has the shape of a straight line having a negative slope. The curve C2 shows that a measure of critical dimension CDm corresponds to a single dose setting value Dm, and that the higher the dose emitted, the lower the critical dimension measured.

To avoid the doubt previously mentioned relating to the focus F setting, it has been suggested to measure the slope of the edge of a pattern. FIG. 3 shows a pattern formed in a resin layer and having a height H. To that end, it is known to measure the critical dimensions of a pattern BCD near the pattern base (for example at 10% of the pattern height H) and that TCD near the upper face of the pattern (for example at 90% of the height H). FIG. 3 also shows the critical dimension measure at average height MCD corresponding to 50% of the height H at which the measurements of FIGS. 1A, 1B, 2A, 2B have been taken. The measures of critical dimension TCD and BCD make it possible to determine the slope SWA of the pattern profile and the critical dimension MCD, and therefore to determine both the value and sign of the focus correction and dose correction to apply to the photolithography machine. Such measurements may be taken by scatterometry. However, these measurements require using complex libraries. They may also be taken by Scanning Electron Microscope SEM, but they are not accurate enough and reveal to be very long to obtain. In addition, such measurements cannot be taken on complex layers, i.e., corresponding for example to transistor gates or layers comprising Shallow Trench Isolation STI. When such measurements are taken on high layers, it may be desired to take in to account the thicknesses of lower layers which are not always homogeneous.

BRIEF SUMMARY

One embodiment of the present disclosure allows for simply and accurately adjusting the focus and dose of a photolithography machine for any layer deposited onto a wafer, without adding manufacturing steps, whatever the number of layers already deposited onto the wafer.

One or more embodiments of the disclosure relate to a method of setting a photolithography exposure machine, comprising: forming on a photolithography mask test patterns and circuit patterns, transferring the patterns to a resin layer covering a wafer, measuring a critical dimension of each test pattern transferred to the resin layer, and determining an error value of a focus setting of the photolithography machine from the measure of the critical dimension of each pattern, the test patterns formed on the mask comprising at least a first reference test pattern and at least a second test pattern forming for a photon beam emitted by the photolithography machine and going through the mask, an optical path having a length different from an optical path formed by the first test pattern and the circuit patterns formed on the mask.

According to one embodiment, the focus setting correction value is determined using the following equation:

$$FE = \frac{\Delta CDm - b}{a \cdot \Delta F}$$

where FE is the focus setting correction value, ΔCDm is a deviation of the critical dimensions measured on each of the test patterns, a and b are coefficients, and ΔF is an optimal focus setting deviation between the two test patterns.

According to one embodiment, the focus deviation value is determined for the optimal focus values of the two test patterns.

According to one embodiment, the method comprises determining an intensity correction value of the photon beam emitted by the photolithography machine, from the focus setting correction value.

According to one embodiment, the intensity correction value of the photon beam emitted by the photolithography machine is determined using the following equation:

$$DE = \frac{d \cdot Dop}{(c \cdot FE^2 + d + e - (CDm1 + CDm2))}$$

where DE is the intensity correction value, c, d and e are coefficients, Dop is an optimal intensity setting value of the photon beam emitted by the photolithography machine, FE is the focus setting correction value, $CD1m$ and $CD2m$ are critical dimensions measured on the two test patterns.

According to one embodiment, forming on the mask the second test pattern comprises: modifying a thickness of an area of a transparent support on which the second test pattern is formed, and/or modifying a thickness of a layer in which the second test pattern is formed, and/or modifying an optical index of an area of a transparent support on which the second test pattern is formed, and/or modifying an optical index of a material forming the second test pattern, and/or forming the second test pattern in a material having optical properties different from those of the material forming the first test pattern and other patterns formed on the mask, and/or adding a layer in a transparent material on or under the transparent support area on which the second test pattern is formed, and/or adding a layer in a transparent material on the second test pattern.

According to one embodiment, the first and second test patterns have identical critical dimensions, and/or identical projected and focused shapes and dimensions.

According to one embodiment, the method comprises: transferring the test patterns to several locations of a wafer covered by a resin layer, by varying at each transfer the focus setting value and/or the intensity setting value of the photon beam emitted by the photolithography machine, measuring critical dimensions of the test patterns transferred to the resin layer, and determining from the measures, a focus setting deviation of the photolithography machine between the two test patterns, an optimal intensity setting value of the photon beam emitted by the photolithography machine, and coefficients of laws of variation of a focus setting error and an intensity setting error of photon beam as a function of the pattern critical dimensions.

According to one embodiment, determining the focus setting deviation of the photolithography machine between the two test patterns, the optimal intensity setting value of the photon beam emitted by the photolithography machine, and the coefficients of the laws of variation of a focus setting error and an intensity setting error of photon beam as a function of the pattern critical dimensions, is performed for several layers to be formed on a wafer.

One or more embodiments of the disclosure also relate to a method of manufacturing integrated circuits on a wafer in a semiconductor material, comprising implementing the method of setting a photolithography machine according to one embodiment of the disclosure.

According to one embodiment, the method of setting a photolithography machine is implemented for several layers to be formed on the wafer.

One or more embodiments of the disclosure also relate to a photolithography mask comprising patterns to be transferred to a resin layer deposited onto a wafer, comprising a first reference test pattern and a second test pattern forming for a photon beam going through the mask, an optical path having a length different from an optical path formed by the first test pattern and the circuit patterns formed on the mask.

According to one embodiment, the mask comprises a support transparent to a photon beam emitted by a photolithography machine, and a layer opaque to the photon beam, deposited onto the support and forming the first and second test patterns and circuit patterns, and the second test pattern differs from the first test pattern and the other patterns formed on the mask by: a thickness of an area of the transparent support where the second pattern is formed, and/or a thickness of an area of the opaque layer where the second test pattern is formed, and/or an optical index of an area of the transparent support where the second test pattern is formed, and/or an optical index of an area of the opaque layer where the second pattern is formed, and/or optical properties of a material of an area of the opaque layer where the second pattern is formed, and/or the presence of a layer in a transparent material added on or under an area of the transparent support where the second test pattern is formed, and/or the presence of a layer in a transparent material on the second test pattern.

According to one embodiment, each test pattern comprises a periodic pattern of parallel segments, arranged between two segments perpendicular to the parallel segments, the parallel segments having a length corresponding to the critical dimension.

BRIEF DESCRIPTION OF THE SEVERAL
VIEWS OF THE DRAWINGS

Embodiments of the disclosure will be described hereinafter, in relation with, but not limited to the appended figures wherein:

FIG. 1A previously described, schematically shows profiles of test patterns formed in a resin layer, on an axis of increasing focus setting values of a photolithography machine;

FIG. 1B previously described, shows a variation curve of the critical dimension of a pattern at average height, as a function of the focus setting of a photolithography machine;

FIG. 2A previously described, schematically shows profiles of test patterns formed in a resin layer on an axis of increasing dose values emitted by a photolithography machine;

FIG. 2B previously described, shows a variation curve of the critical dimension of a pattern CD at average height, as a function of the dose setting emitting by a photolithography machine;

FIG. 3 previously described, shows a test pattern profile;

FIG. 4 schematically shows a photolithography exposure machine;

DETAILED DESCRIPTION

Figure 4:
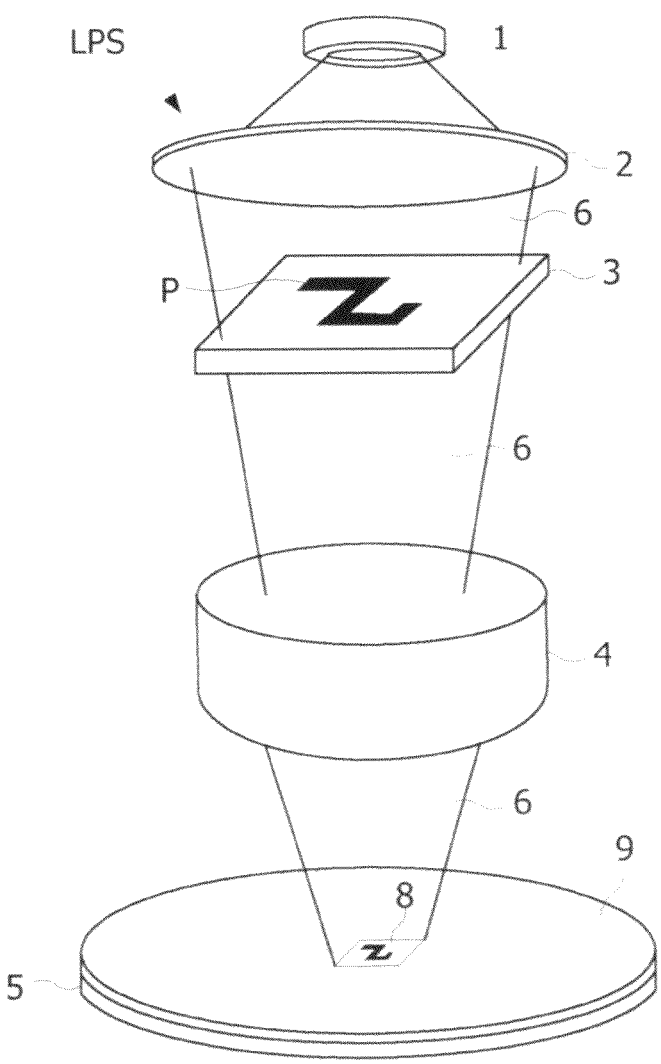

FIG. 4 shows a photolithography exposure machine LPS. The machine LPS comprises a light source 1 emitting a photon beam 6, a projection optic 2, also called "condenser", a mask 3, and a focus optic 4. The projection optic 2 conventionally comprises one or more lenses to transmit the light beam 6 coming from the source 1 to the mask 3. The focus optic 4 conventionally comprises one or more lenses to focus the light which have gone through the mask 3 onto an area 8, called "field", of a photoresist layer 9 deposited on a wafer 5 for example in a semiconductor material. The focus optic 4 may be configured to project a clear image of patterns P of the mask 3 onto the resin layer 9 on the wafer 5. The machine LPS thus allows the patterns P formed by the mask 3 to be projected onto the area 8 so as to make one or more circuits thereon. The optics 2 and 4 may be configured so that the photon beam 6 perpendicularly reaches and goes through the mask 3.

Figure 5:
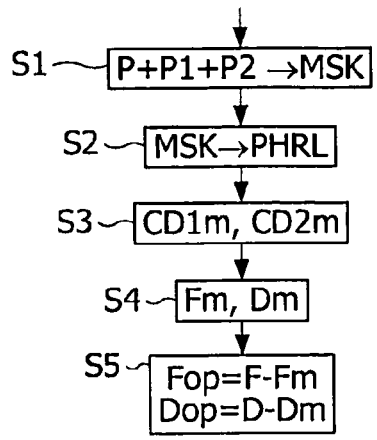
FIG. 5 shows steps of a photolithography process comprising a focus and dose setting of a photolithography machine, according to one embodiment.

FIG. 5 shows steps of a photolithography process comprising a focus and dose setting of the machine LPS, according to one embodiment. In FIG. 5, the method comprises steps S1 to S5. At step S1, test patterns and circuit patterns P are formed on a photolithography mask 3. The test patterns comprise at least a first test pattern P1, used as reference pattern, and a second test pattern P2. The second test pattern is formed on the mask 3 so as to form for the photon beam 6 emitted by the machine LPS and going through the second pattern P2, a length of optical path different from that of the reference pattern P1. Thus, the patterns P, P1, P2 formed on the mask 3 may be simultaneously transferred to the resin layer 9, with two different focus values, i.e., a focus value corresponding to the first test pattern P1 and the circuit patterns P of the mask 3 and a focus value corresponding to the second test pattern P2. At step S2, the patterns P, P1, P2 on the mask 3 are transferred to the resin layer 9 deposited on a wafer, using the machine LPS. At step S3, a critical dimension CD1$m$, CD2$m$ of each test pattern P1, P2 transferred to the resin layer is measured. At step S4, the measured CD1$m$, CD2$m$ are used to deduce the focus error FE and dose error DE values allowing the photolithography machine to be set. At step S5, the correction values FE and DE are applied to the photolithography machine, which is the same as subtracting the error values FE, DE from the current focus F and dose D setting values of the machine, to reach corresponding optimal values Fop, Dop.

It is to be appreciated that some or all of the steps of the illustrated method may be performed sequentially, in parallel, omitted, or in an order different from the order described and illustrated.

Figure 6A:
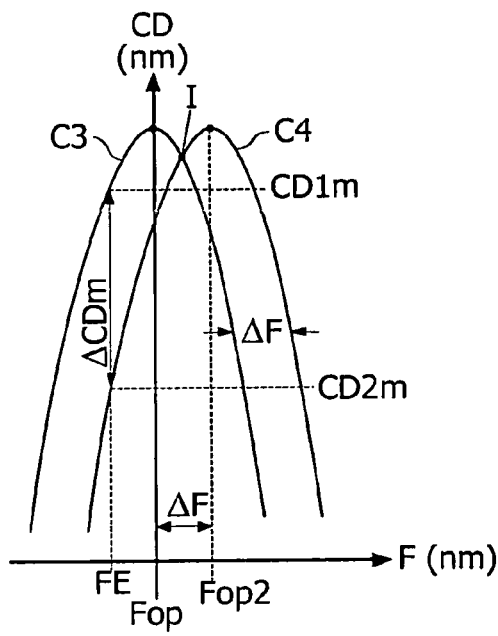
FIG. 6A shows variation curves of critical dimension of two test patterns transferred from a mask to a resin layer.

FIG. 6A shows variation curves C3, C4 of the critical dimension CD of the test patterns P1, P2, as a function of the focus F setting of the photolithography machine. Each variation curve C3, C4 of the critical dimension CD of one of the test patterns has the shape of a parabola having a maximum value at the top of the parabola for an optimal focus setting value Fop, Fop2. As the two test patterns correspond to a determined focus deviation $\Delta F$, the curves C3, C4 have substantially identical shapes and are simply offset from one another by the deviation $\Delta F$ according to the axis of the abscissas corresponding to the focus F values.

Figure 6B:
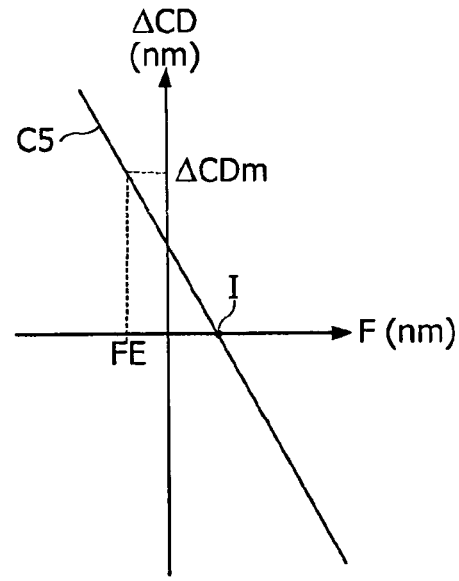
FIG. 6B shows a variation curve of the difference between the two curves of FIG. 6A.

FIG. 6B shows a variation curve C5 of the critical dimension deviation $\Delta CD$ as a function of the focus F setting of the photolithography machine. The curve C5 has the shape of a straight line going through the abscissa axis in a point I corresponding to an intercept point between the two curves C3, C4. The curves C3, C4, C5 show that the deviation of the critical dimensions CD1$m$, CD2$m$ measured at step S3 may be modeled as a function of a focus setting error FE (deviation between a current focus setting value of the photolithography machine and the optimal focus setting value Fop) by the following equation:

$$\Delta CDm = CD1m - CD2m = a \cdot \Delta F \cdot FE + b \quad (1)$$

where a and b are coefficients, and CD1$m$ and CD2$m$ are critical dimension measurements taken on the two test patterns P1, P2 respectively.

In addition, a dose setting error DE (deviation between the current dose setting value of the photolithography machine and an optimal dose setting value Dop) may be deduced from the following equation:

$$CD1m + CD2m = c \cdot FE^2 + d\left(1 - \frac{Dop}{DE}\right) + e \quad (2)$$

where c, d, e are coefficients.

The equations (1) and (2) make it possible to determine at step S4, the focus setting error Fm, and the dose setting error Dm, by applying the following equations:

$$\begin{cases} FE = \dfrac{\Delta CDm - b}{a \cdot \Delta F} \\ DE = \dfrac{d \cdot Dop}{(c \cdot FE^2 + d + e - (CDm1 + CDm2))} \end{cases} \quad (3)$$

The result is that by taking a single measurement of critical dimension CD1$m$, CD2$m$ on each of the test patterns P1, P2, it is possible to determine focus error FE and dose error DE values. These error values allow focus and dose correction values to be deduced (equal to –FE and –DE) to be applied to the photolithography machine at step S5 to reach the optimal values Fop, Dop.

The coefficients a, b, c, d, e may be determined only once, by transferring the test patterns P1, P2 to a resin layer deposited onto a reference wafer, several times to different locations of the reference wafer, and for different focus F and D setting values, and by measuring the critical dimension CD1$m$, CD2$m$ of each test pattern P1, P2 transferred to the resin layer. To that end, the field 8 of the machine LPS projecting the patterns P1, P2 may also be moved by steps having the field width on the reference wafer, in a direction for example by increasing the focus at each step from a certain value, and a perpendicular direction, for example by increasing the dose at each step from a minimum dose value.

The measures CD1$m$, CD2$m$ also allow the curve C3, C4 to be drawn and the focus deviation ΔF between the two patterns P1, P2 to be determined. In practice, the focus deviation ΔF appearing in the equations (1) and (3) is determined for the optimal focus values Fop, Fop2 of the two test patterns P1, P2, these values being determined from the lines of the curves C3 and C4.

Determining the coefficients a, b, c, d, e and the focus deviation ΔF may be performed for each layer to be formed on a wafer in a manufacturing line, requiring accurate focus and dose settings. This determination is performed once for each layer to be formed on a wafer, for a given product and a given technology.

Figure 7:
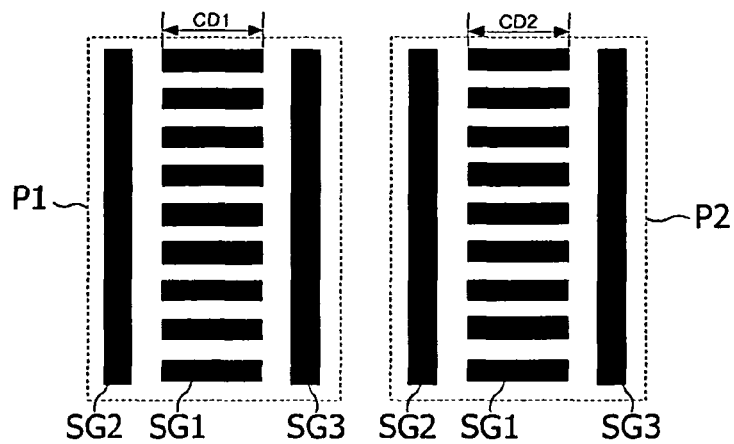
FIG. 7 shows in top view test patterns on a mask, according to one embodiment.

FIG. 7 shows test patterns P1, P2, according to one embodiment. In FIG. 7, the test patterns P1, P2 have projected and focused shapes which may be identical, and each comprise a periodic pattern of parallel segments SG1, arranged between two segments SG2, SG3 perpendicular to the segments SG1. The periodic distribution of the segments SG1 is adapted to measurement by scatterometry, while remaining compatible with other measurement tools used in the field of microelectronics. The length of the segments SG1 corresponds to the critical dimension CD1, CD2 of the pattern. The segments SG2, SG3 allow the sensitivity of the pattern to focus setting to be increased. The distance between the segment SG2 or SG3 and the segments SG1 may be determined to increase the sensitivity of the pattern to focus and dose settings.

Admittedly, test patterns having other shapes can be used to obtain focus and dose setting deviations in accordance with the method previously described.

FIGS. 8A to 8F show various embodiments of pairs of test patterns formed on a photolithography mask, having a focus deviation or forming optical paths of different lengths. Conventionally, a photolithography mask comprises a plate SB in a material transparent to the photon beam emitted by the photolithography machine, and a layer in a material opaque to the photon beam deposited onto the plate and forming the patterns P, P1, P2 to be transferred to a resin layer. The plate SB is usually made in quartz, and the patterns are forms in a chromium layer. In FIGS. 8A to 8F, each pair of patterns comprises a pattern P1 and a pattern P2$a$ ... P2$d$ whose shape in top view is identical to the pattern P1. The pattern P1 is formed in a thickness H2 of opaque material, on an area of the plate SB having a thickness H1, like the other patterns to be transferred to a resin to manufacture integrated circuits.

Figure 8A:
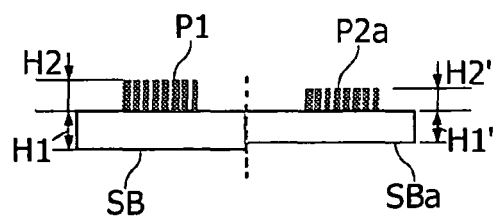
FIGS. 8A to 8F show in cross-section various embodiments of test patterns formed on a mask, to be transferred to a resin layer.

In FIG. 8A, the pattern P2$a$ is formed in a thickness H2' of opaque material which may differ from the thickness H2, and/or on an area SBa of the plate SB having a thickness H1' which may differ from the thickness H1. In the example of FIG. 8A, at least one of the thicknesses H1', H2' is lower than the corresponding thickness H1, H2, so that the pattern P2 corresponds to a length of optical path (or a focus setting value) lower than that of the pattern P1. Alternately, the thickness H1', and/or the thickness H2' may be provided greater than the corresponding thickness H1, H2.

Figure 8B:
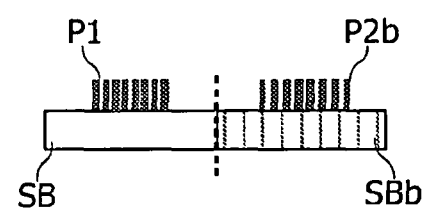

In FIG. 8B, the pattern P2$b$ is formed on an area SBb of the plate SB having a modified optical index, for example modified by injection of electrons or ions. The opaque layer forming the pattern P2$b$ may also have a modified optical index with respect to the layer forming the pattern P1. To that end, the optical index of the opaque layer forming the pattern P2$b$ may be locally modified for example by injecting electrons, photons or by ion bombardment.

Figure 8C:
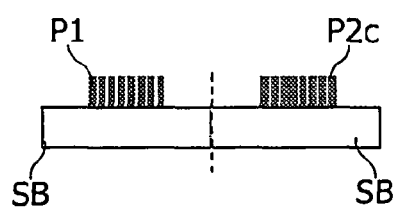

In FIG. 8C, the pattern P2$c$ is formed in a layer of a material having optical properties differing from that in which the pattern P1 is formed.

Figure 8D:
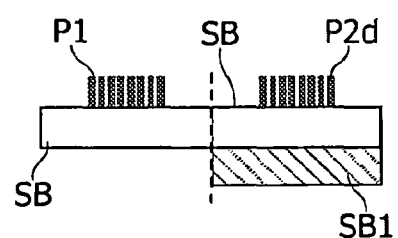

In FIG. 8D, the lower face of the area of the plate SB on which the pattern P2$d$ is formed is locally covered by a layer SB1 in a transparent material. The material in which the pattern P2$d$ is made may be identical or different from that forming the pattern P1. The transparent material forming the layer SB1 may be identical or different from that of the plate SB.

Figure 8E:
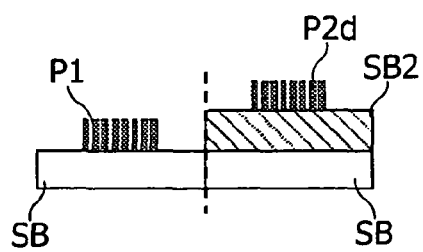

In FIG. 8E, the area of the plate SB where the pattern P2$d$ is formed is previously covered by a layer SB2 in a transparent material, the pattern P2$d$ being formed on the layer SB2. The transparent material forming the layer SB2 may be identical or different from that of the plate SB.

Figure 8F:
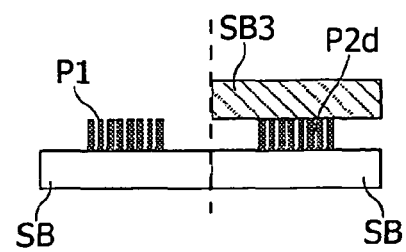

In FIG. 8F, the pattern P2$d$ is formed on the plate SB and covered by a layer SB3 in a transparent material which may be identical or different from that forming the plate SB. It is to be noted that in the examples of FIGS. 8D to 8F the length of the optical path going through the pattern P2 is greater than that of the optical path going through the pattern P1.

The various means of forming optical paths of various lengths between the pattern P1, on the one hand and on the other hand, one of the patterns P2$a$ ... P2$d$, shown in FIGS. 8A to 8F may admittedly be combined. In addition, it may also be provided to totally or partially embed the additional layers SB1 and SB2 into a cavity previously formed in the plate SB.

The difference of optical path lengths thus obtained between the two patterns P1, and P2 (a ... d) may for example reach values greater than 1600 nm. With a deviation of optical path length of 1600 nm, the focus deviation ΔF between the two patterns P1, P2 may reach 100 nm.

It will be clear to those skilled in the art that the present disclosure is susceptible of various embodiments and applications. In particular, the disclosure does not require that the two test patterns be identical. The implementation of the setting method according to the disclosure simply provides that the two test patterns have known critical dimensions. The use of test patterns having identical critical dimensions simply allows the focus and dose deviations to be more easily determined. Furthermore, more than two test patterns may be provided to obtain focus deviation values in various areas of a wafer.

Figure 1A:
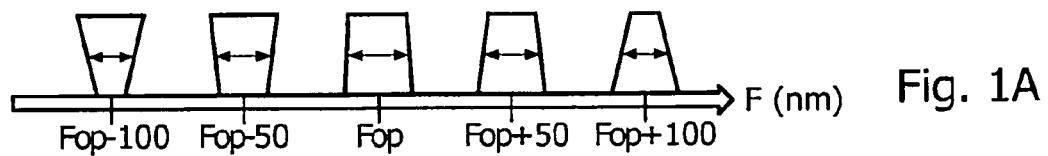
Figure 1B:
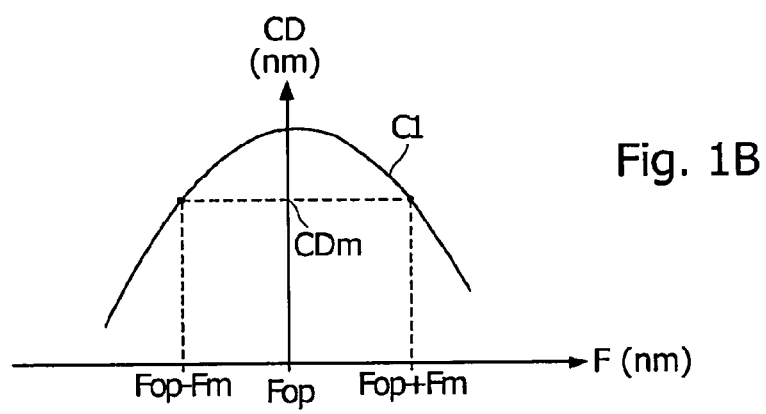
Figure 2A:
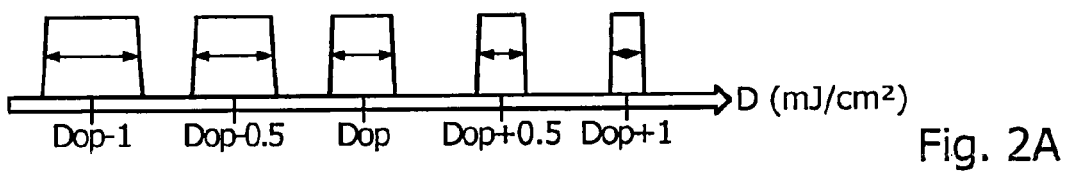
Figure 2B:
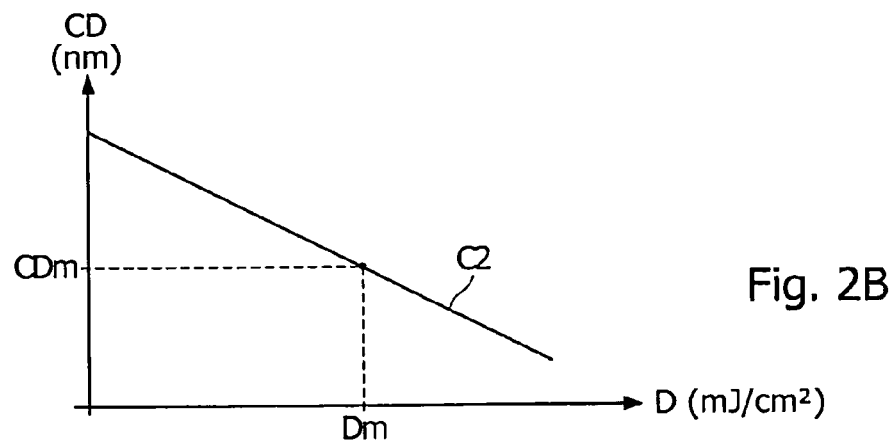
Figure 3:
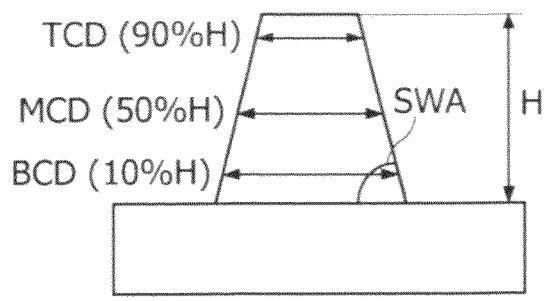

In addition, in some manufacturing lines, it may not be necessary to accurately set the dose. In addition, as soon as a focus setting error FE is determined, it is not necessary to implement the equation (3) to determine the dose setting error. Indeed, the curve of FIG. 2B may be used.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:
1. A method comprising:
forming test patterns on a photolithography mask, the test patterns including a first reference test pattern and a second test pattern, the second test pattern having an optical path that has a length different from an optical path formed by the first reference test pattern;

using a photolithography machine, transferring the test patterns to a resin layer on a substrate;

measuring a critical dimension of each test pattern on the resin layer; and determining an error value of a focus setting of the photolithography machine based in part on the measured critical dimension of each test pattern.

2. The method of claim 1, wherein the determining includes determining the error value using the following equation:

$$FE = \frac{\Delta CDm - b}{a \cdot \Delta F}$$

where FE is the error value of the focus setting, $\Delta CDm$ is a deviation of the critical dimensions measured on the test patterns, a and b are coefficients, and $\Delta F$ is an optimal focus setting deviation between the test patterns.

3. The method of claim 2, wherein $\Delta CDm$ is determined for optimal focus values of the test patterns.

4. The method of claim 1, comprising determining an intensity correction value of a photon beam emitted by the photolithography machine from the error value of the focus setting.

5. The method of claim 4, wherein the intensity correction value of the photon beam emitted by the photolithography machine is determined using the following equation:

$$DE = \frac{d \cdot Dop}{(c \cdot FE^2 + d + e - (CDm1 + CDm2))}$$

where DE is the intensity correction value, c, d and e are coefficients, Dop is an optimal intensity setting value of a photon beam emitted by the photolithography machine, FE is the error value of the focus setting, CD1m and CD2m are critical dimensions measured on the test patterns.

6. The method of claim 1, wherein forming the second test pattern comprises at least one of:

modifying a thickness of an area of a transparent support on which the second test pattern is formed;

modifying a thickness of a layer in which the second test pattern is formed;

modifying an optical index of an area of a transparent support on which the second test pattern is formed;

modifying an optical index of a material forming the second test pattern;

forming the second test pattern in a material having optical properties different from those of the material forming the first test pattern and other patterns formed on the mask;

adding a layer in a transparent material on or under the transparent support area on which the second test pattern is formed; and adding a layer in a transparent material on the second test pattern.

7. The method of claim 1, wherein the first and second test patterns have at least one of substantially similar critical dimensions and substantially similar projected and focused shapes and dimensions.

8. The method of claim 1, comprising:

transferring the test patterns to the resin layer on the substrate at a plurality of locations by varying at each transfer at least one of a focus setting value and a intensity setting value of the photon beam emitted by the photolithography machine;

measuring critical dimensions of the test patterns transferred to the resin layer, and determining from the measurements, a focus setting deviation of the photolithography machine between the test patterns, an optimal intensity setting value of the photon beam emitted by the photolithography machine, and coefficients of laws of variation of a focus setting error and an intensity setting error of photon beam as a function of the pattern critical dimensions.

9. The method of claim 8, wherein determining the focus setting deviation of the photolithography machine between the test patterns, the optimal intensity setting value of the photon beam emitted by the photolithography machine, and the coefficients of the laws of variation of a focus setting error and an intensity setting error of photon beam as a function of the pattern critical dimensions, is performed for several layers to be formed on the substrate.

10. A method of manufacturing integrated circuits on a semiconductor wafer, the method comprising:

emitting a photon beam from a photolithography machine through a photolithography mask, the photolithography mask including a first test pattern, a second test pattern, and a circuit pattern, the second test pattern having an optical path that has a length different from an optical path formed by the first test pattern;

transferring the first test pattern, the second test pattern, and the circuit pattern to a resin layer on the semiconductor wafer;

measuring a critical dimension of the first reference test pattern and the second test pattern on the resin layer; and using the measured critical dimension of the first test pattern and the second test pattern to determine an error value of a focus setting of the photolithography machine.

11. The method of claim 10, wherein the steps of the method are implemented for several layers to be formed on the semiconductor wafer.

12. The method of claim 10, wherein the error value of the focus setting of the photolithography machine is determined using the following equation:

$$FE = \frac{\Delta CDm - b}{a \cdot \Delta F}$$

where FE is the error value of the focus setting, $\Delta CDm$ is a deviation of the critical dimensions measured on the test patterns, a and b are coefficients, and $\Delta F$ is an optimal focus setting deviation between the first reference test pattern and the second test pattern.

13. The method of claim 10, wherein $\Delta CDm$ is determined for optimal focus values of the first test pattern and the second test patterns.

14. The method of claim 10, wherein the first test pattern and the second test pattern are transferred to the resin layer on the semiconductor wafer at substantially the same time.

* * * * *